United States Patent
Adkins et al.

(10) Patent No.: US 6,609,781 B2
(45) Date of Patent: Aug. 26, 2003

(54) PRINTER SYSTEM WITH ENCODER FILTERING ARRANGEMENT AND METHOD FOR HIGH FREQUENCY ERROR REDUCTION

(75) Inventors: Christopher Alan Adkins, Lexington, KY (US); Lucas David Barkley, Lexington, KY (US); Michael Anthony Marra, III, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 33 days.

(21) Appl. No.: 09/736,075

(22) Filed: Dec. 13, 2000

(65) Prior Publication Data

US 2002/0126165 A1 Sep. 12, 2002

(51) Int. Cl.[7] .................................... B41J 23/00
(52) U.S. Cl. ........................................... 347/37
(58) Field of Search ................. 347/37; 318/640; 400/279, 705, 709, 582; 327/551, 552, 559, 156, 311

(56) References Cited

U.S. PATENT DOCUMENTS

| | | |
|---|---|---|
| 3,649,821 A | 3/1972 | Gumacos |
| 3,824,498 A | 7/1974 | McBride |
| 3,913,028 A | 10/1975 | Bosselaers |
| 3,936,762 A | 2/1976 | Cox, Jr. et al. |
| 4,143,328 A | 3/1979 | Kurita et al. |
| 4,156,169 A | 5/1979 | Imamura |
| 4,158,800 A | 6/1979 | Jahelka et al. |
| 4,160,200 A | 7/1979 | Imamura et al. |
| 4,195,938 A | 4/1980 | Velasquez |
| 4,215,301 A | 7/1980 | Mason |
| 4,227,133 A | 10/1980 | Imamura |
| 4,270,868 A | 6/1981 | Morgan et al. |
| 4,343,012 A | 8/1982 | Knapp |
| 4,349,887 A | 9/1982 | Crowley |
| 4,415,286 A | 11/1983 | Jennings |
| 4,457,639 A | 7/1984 | Nagai |

(List continued on next page.)

OTHER PUBLICATIONS

Ovaska, Seppo J. Predictive Compensation of Time–Varying Computing Delay on Real–Time Control Systems Institute of Electrical & Electronics Engineers Journal, Transactions on Control Systems Technology, vol. 5, No. 5 (Sep., 1997), pp. 523–523.*

J.A. Honkanen, T. I. Laasko, S.J. Ovaska, I.O. Hartimo, "Lowpass IIR Predictors for Discrete–Time Signal Processing," Digital Signal Processing, vol. 5, (No. 3), pp. 133–139, (Jul. 18, 1995).

Seppo J. Ovaska, Olli Vainio and Timo I. Laasko, "Design of Predictive IIR Filters via Feedback Extension of FIR Forward Predictors," IEEE Transactions on Instrumentation and Measurement, IEEE, vol. 46 (No. 5), pp. 1196–1201, (Oct., 1997).

*Primary Examiner*—Judy Nguyen
*Assistant Examiner*—Julian D. Huffman
(74) *Attorney, Agent, or Firm*—Thompson Hine LLP

(57) ABSTRACT

A printhead firing control system for an inkjet printer includes a printhead mounted for movement across a paper path and an encoder for producing a digital output signal indicative of movement of the printhead. A filter circuit is connected to receive the digital output signal for filtering the digital output signal to remove frequency variations which meet at least one predetermined parameter, thereby providing a filtered digital signal. A fire-pulse generation circuit receives the filtered digital signal from the filter circuit and produces printhead heater resistor drive pulses based at least in part upon the filtered digital signal. This arrangement provides for improved printing accuracy by eliminating frequency changes in the digital encoder signal which may erroneously be caused by mechanical vibrations or other noise within the printer. An improved digitally controlled oscillator construction is also described.

11 Claims, 7 Drawing Sheets

U.S. PATENT DOCUMENTS

| | | | |
|---|---|---|---|
| 4,460,968 A | | 7/1984 | Cavill et al. |
| 4,461,984 A | | 7/1984 | Whitaker et al. |
| 4,494,073 A | | 1/1985 | Sorgi .......................... 327/105 |
| 4,518,998 A | * | 5/1985 | Warner ....................... 348/205 |
| 4,525,726 A | | 6/1985 | Mori |
| 4,529,325 A | | 7/1985 | Moon |
| 4,546,299 A | | 10/1985 | Veale |
| 4,577,163 A | | 3/1986 | Culp |
| 4,669,900 A | | 6/1987 | Miyake et al. |
| 4,723,129 A | * | 2/1988 | Endo et al. ................... 347/56 |
| 4,789,874 A | | 12/1988 | Majette et al. |
| 4,806,034 A | | 2/1989 | Plummer |
| 4,809,020 A | | 2/1989 | Agulnek |
| 4,832,518 A | | 5/1989 | Moriyama |
| 4,869,610 A | | 9/1989 | Nishizawa et al. |
| 4,870,559 A | | 9/1989 | Hyatt |
| 4,999,558 A | | 3/1991 | Onodera et al. |
| 5,111,151 A | | 5/1992 | Ii |
| 5,126,754 A | | 6/1992 | Spinar |
| 5,156,478 A | | 10/1992 | Jobs |
| 5,162,746 A | | 11/1992 | Ghoshal |
| 5,207,520 A | | 5/1993 | Tanaka et al. |
| 5,241,525 A | | 8/1993 | Taylor |
| 5,245,359 A | | 9/1993 | Ito et al. |
| 5,250,956 A | | 10/1993 | Haselby et al. |
| 5,288,157 A | | 2/1994 | Tanaka |
| 5,289,208 A | | 2/1994 | Haselby |
| 5,297,017 A | | 3/1994 | Haselby et al. |
| 5,337,335 A | * | 8/1994 | Cloetens et al. ............ 327/156 |
| 5,368,402 A | | 11/1994 | Takahashi et al. |
| 5,397,192 A | | 3/1995 | Khormaee |
| 5,416,395 A | | 5/1995 | Hiramatsu et al. |
| 5,426,457 A | | 6/1995 | Raskin |
| 5,427,461 A | | 6/1995 | Hirai et al. |
| 5,433,542 A | | 7/1995 | Masuda et al. |
| 5,434,602 A | | 7/1995 | Kaburagi et al. |
| 5,442,324 A | | 8/1995 | Brauns et al. |
| 5,448,269 A | | 9/1995 | Beauchamp et al. |
| 5,502,751 A | | 3/1996 | Killian |
| 5,517,155 A | | 5/1996 | Yamauchi et al. |
| 5,519,415 A | | 5/1996 | Raskin |
| 5,547,296 A | | 8/1996 | Iwazawa |
| 5,561,449 A | | 10/1996 | Raskin |
| 5,598,201 A | | 1/1997 | Stodder et al. |
| 5,600,350 A | | 2/1997 | Cobbs et al. |
| 5,600,352 A | | 2/1997 | Knierim et al. |
| 5,605,407 A | | 2/1997 | Hama et al. |
| 5,625,269 A | | 4/1997 | Ikeda |
| 5,627,570 A | | 5/1997 | Hiramatsu et al. |
| 5,644,344 A | | 7/1997 | Haselby |
| 5,652,426 A | | 7/1997 | Maeda |
| 5,663,624 A | | 9/1997 | Callaway |
| 5,719,412 A | | 2/1998 | Murayama |
| 5,748,206 A | | 5/1998 | Yamane |
| 5,760,807 A | | 6/1998 | Yamazaki et al. |
| 5,774,074 A | | 6/1998 | Cooper et al. |
| 5,789,985 A | | 8/1998 | Yamauchi et al. |
| 5,803,628 A | | 9/1998 | Donahue |
| 5,815,172 A | | 9/1998 | Moh |
| 5,819,649 A | | 10/1998 | Townsend et al. |
| 5,821,970 A | | 10/1998 | Sasaki et al. |
| 5,825,378 A | | 10/1998 | Beauchamp |
| 5,838,359 A | | 11/1998 | Hoover |
| 5,839,046 A | | 11/1998 | Takano et al. |
| 5,861,726 A | | 1/1999 | Uchikata et al. |
| 5,867,068 A | | 2/1999 | Keating |
| 5,872,487 A | | 2/1999 | Adachi et al. |
| 5,905,388 A | | 5/1999 | Van Der Valk et al. |
| 5,977,836 A | | 11/1999 | Swan et al. ................. 331/1 A |

* cited by examiner

PRINTER SYSTEM WITH ENCODER FILTERING ARRANGEMENT AND METHOD FOR HIGH FREQUENCY ERROR REDUCTION

TECHNICAL FIELD

The present invention relates generally to printer systems employing encoders for providing positioning information regarding printhead carriages and, more particularly, to a printhead firing control system including an encoder signal filtering arrangement and method for reducing high frequency errors in the encoder output signal.

BACKGROUND OF THE INVENTION

Thermal ink jet printer mechanisms which utilize printheads having heater resistors for effecting the ejection of small ink droplets from the printhead are well known. The ejection of a large number of small ink droplets at controlled locations on a printing medium produces a desired printed image. In such printer mechanisms the printhead typically moves with a carriage across a paper path and firing pulses are produced to position the ejected ink droplets at desired locations on the paper. However, the digital output signal produced by the encoder can include high frequency error components which result in reduced accuracy in controlling the positioning of ejected droplets.

Accordingly, it would be advantageous to provide a printhead firing control system which accounts for such high frequency error components in order to increase printing accuracy.

SUMMARY OF THE INVENTION

In one aspect of the invention, a printhead firing control system for an inkjet printer includes a printhead mounted for movement across a paper path and an encoder for producing a digital output signal indicative of movement of the printhead. A filter circuit is connected to receive the digital output signal for filtering the digital output signal to remove frequency variations which meet at least one predetermined parameter, thereby providing a filtered digital signal. A fire-pulse generation circuit receives the filtered digital signal from the filter circuit and produces printhead heater resistor drive pulses based at least in part upon the filtered digital signal. This arrangement provides for improved printing accuracy by eliminating frequency changes in the digital encoder signal which may erroneously be caused by mechanical vibrations or other noise within the printer.

In another aspect of the present invention, a method for providing increased printing accuracy in an inkjet printer system involves providing an encoder for producing a digital output signal indicative of movement of a printhead across a paper path and monitoring the digital output signal. Frequency changes in the digital output signal which occur at a rate faster than a threshold change rate are eliminated to produce a filtered digital signal. Printhead firing pulses are then produced based at least in part upon the filtered digital signal.

One type of filter which may be utilized in the subject system and method is a digital phase-locked loop filter (DPLL). In this regard, a further aspect of the invention provides a digital oscillator, which may be used in the DPLL in place of a traditional analog voltage controlled oscillator. The digital oscillator includes a period resolution circuit and a frequency generator circuit. The period resolution circuit includes an input for receiving a digital frequency selection input value, a digital multiplier for multiplying the input value by a gain value and outputting a resultant value, a digital adder for adding a minimum frequency value to the resultant value and outputting a summed value, and a digital divider for dividing a digital clock frequency value by the summed value, the digital divider outputting a count value indicative of a number clock frequency pulses occurring during one half of a period of a desired oscillator output frequency. The frequency generator circuit is connected to receive the count value from the period resolution circuit and includes a digital counter for receiving count value s from the period resolution circuit, and a digital toggle circuit associated with the digital counter for producing an oscillating output signal, the toggle circuit responsive to the digital counter to vary the oscillating output signal between high and low levels.

DETAILED DESCRIPTION

Figure 1:
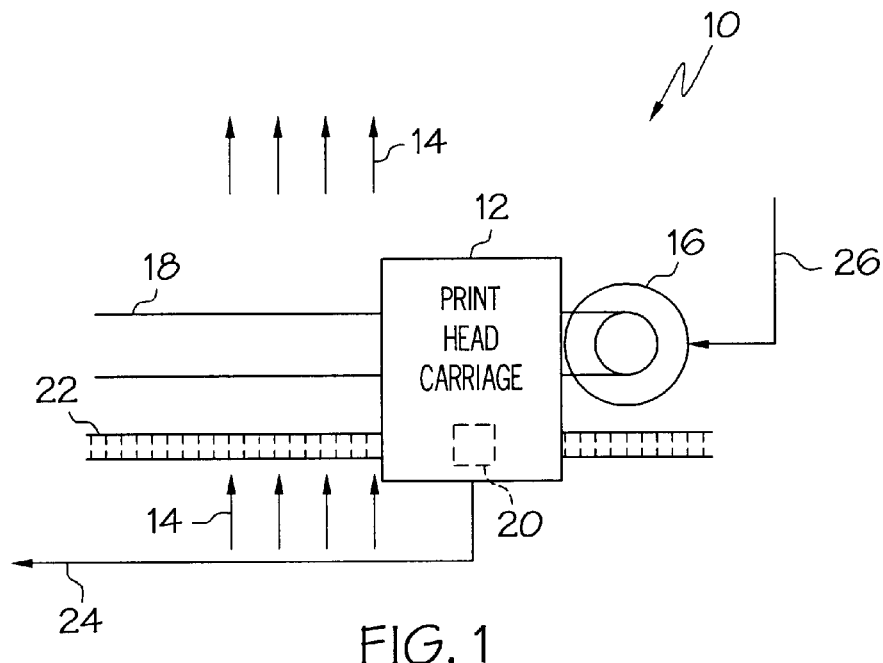
FIG. 1 is a schematic diagram of a printhead carriage arrangement.

Referring to FIG. 1, a partial view of a printhead carriage system 10 is illustrated and includes a printhead carriage 12 having a printhead mounted thereon. The printhead carriage 12 and associated printhead are mounted for movement across a paper path defined by arrows 14. Movement of the printhead carriage 12 is controlled via a DC motor 16 and associated belt drive 18. An encoder sensor 20 operates in conjunction with a linear encoder strip 22 to produce a movement indicative encoder output signal on line 24. A motor control input line 26 is also shown.

Figure 2:
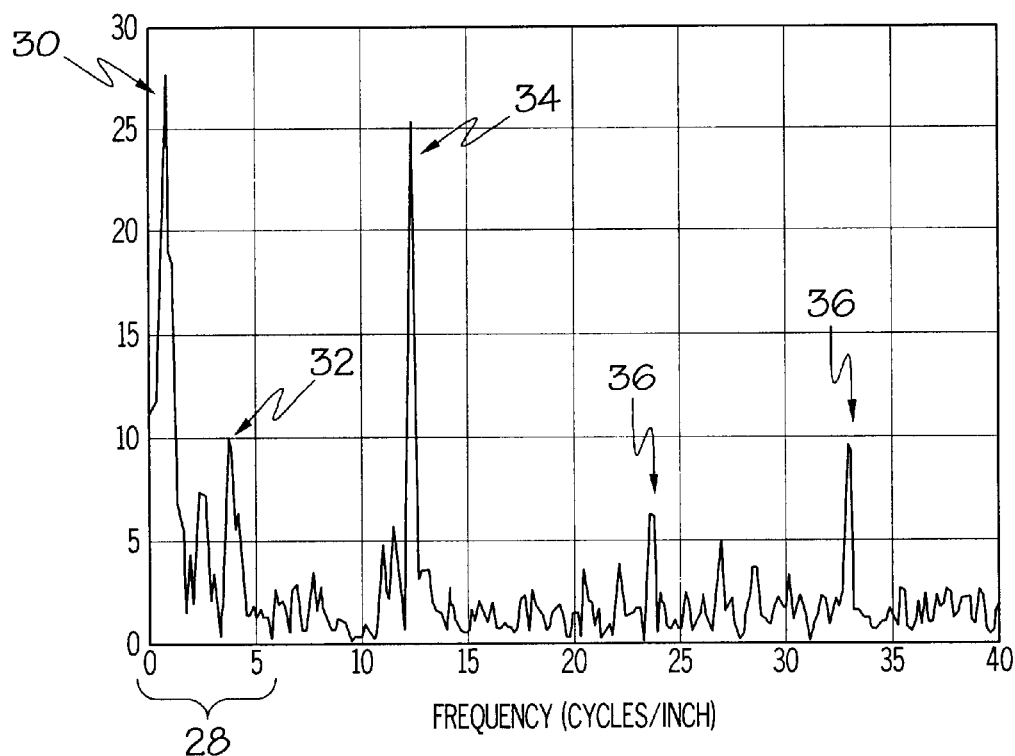
FIG. 2 is a graph illustration frequency components of an unfiltered encoder signal.

FIG. 2 represents an exemplary frequency spectrum of the encoder output signal produced at line 24. The useful or critical information concerning printhead carriage movement is typically contained within frequency range 28. Carrier natural frequencies are shown at 30 and frequency components caused by motor cogging disturbances are shown at 32. The large frequency component shown at 34 is typically caused by belt disturbances in the carriage drive, which may be amplified by other system components. The frequency component shown at 36 represents encoder strip errors which may also be amplified by other system components. The encoder output signal is used by the printer controller to track the position and velocity of the printhead in order to generate heater resistor drive pulses at the appropriate times as necessary to deliver ink to paper moving along the paper path 14 in a controlled manner which produces a desired print of high quality. In this regard, the presence of the higher frequency components 34 and 36 in the encoder output signal can result in a less than desired print quality and therefore the present invention is intended to eliminate such frequency components in order to improve the print quality.

Figure 3:
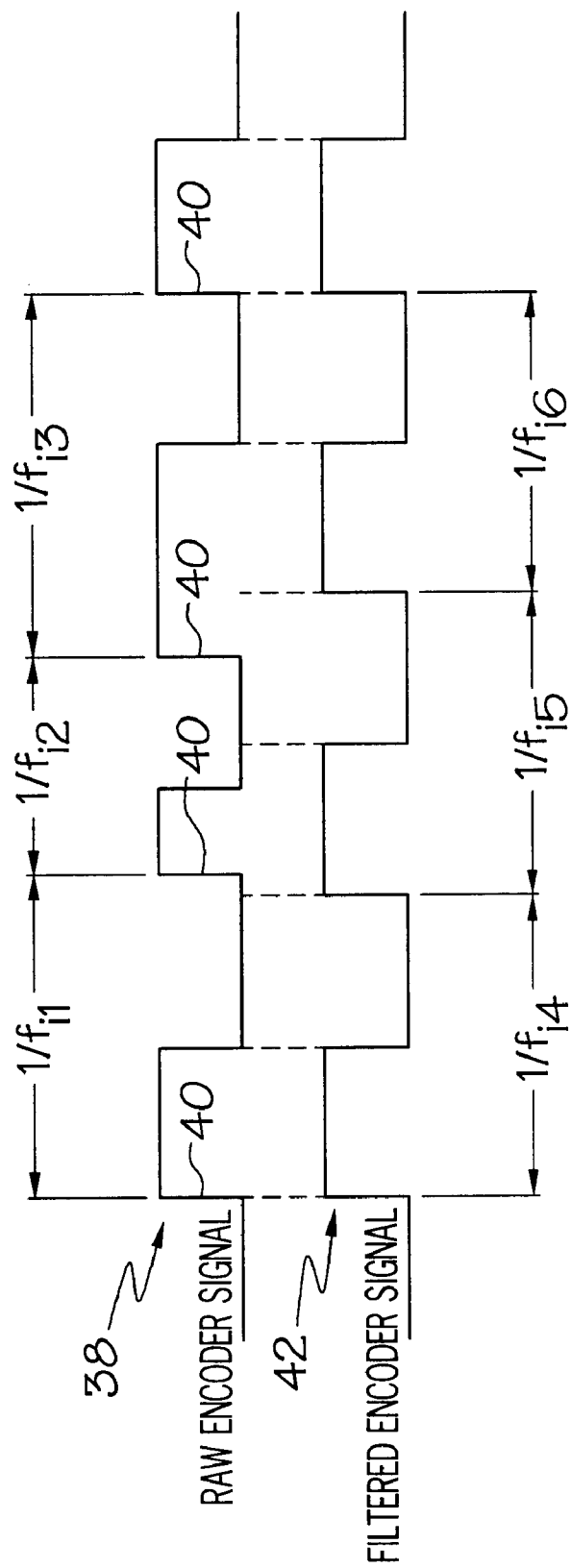
FIG. 3 shows a timeline depicting a standard encoder signal and a frequency filtered encoder signal.
Figure 4A:
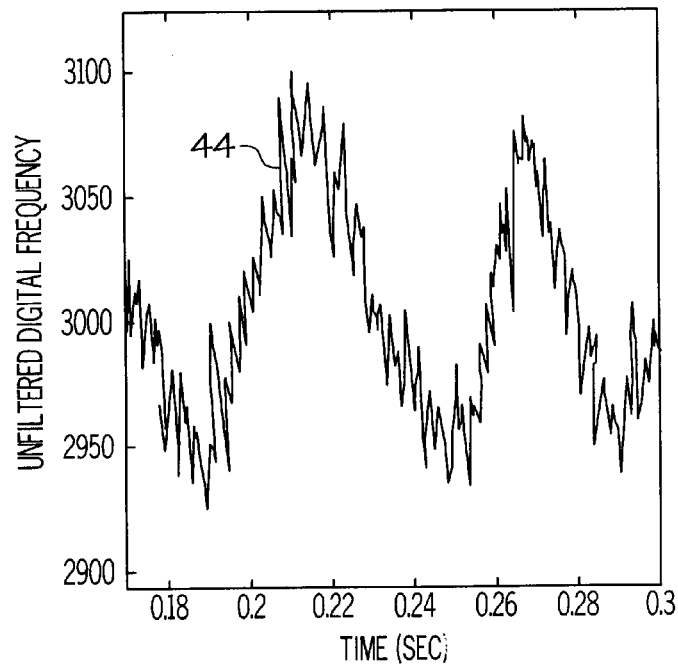
FIGS. 4A and 4B are graphs illustrating frequency variations in a standard encoder signal and a frequency filtered encoder signal respectively.
Figure 4B:
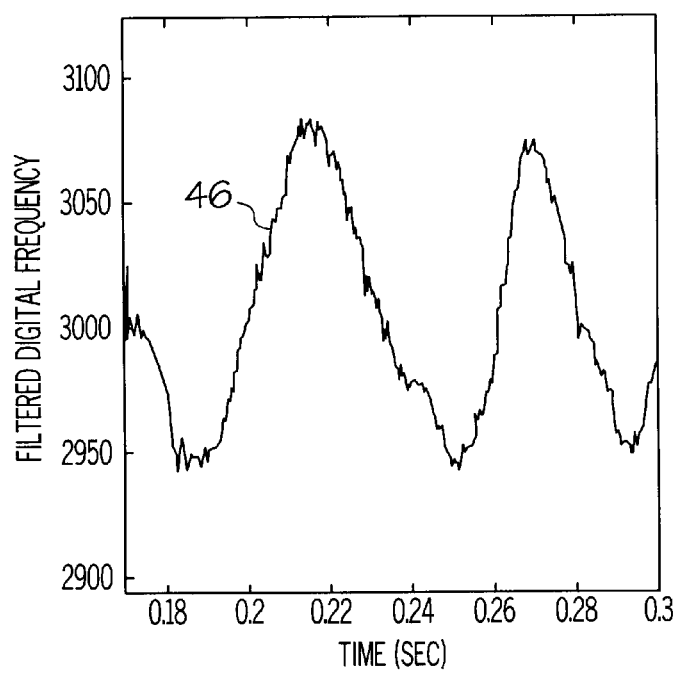

The advantages provided by frequency filtering of the encoder output signal are best seen with reference to FIGS. 3 and 4. FIG. 3 depicts a raw encoder signal 38 as produced on output line 24. In many systems the print control relies on the rising edges (a low to high transition) 40 of the signal as representing the location of the printhead carriage and printhead relative to the paper or other media. Additionally, the time between consecutive rising edges 40 is utilized by the print system as a representation of the velocity of the printhead carriage and printhead. Noise within the system may cause the period of the encoder signal to change very quickly such that the instantaneous frequency of the digital encoder signal 38 as represented by $f_{i1}$, $f_{i2}$, and $f_{i3}$, likewise changes very quickly. In the illustrated signal 38 the instantaneous frequency $f_{i2}$ is much greater than both the instantaneous frequency $f_{i1}$ and $f_{i3}$. By filtering out very fast changes in the digital frequency of the encoder signal, a more accurate representation of the actual position and speed of the printhead carriage and printhead can be obtained as seen with reference to the filtered encoder signal 42, where any difference between instantaneous frequencies $f_{i4}$, $f_{i5}$, and $f_{i6}$ is much smaller. FIGS. 4a and 4b illustrate graphs 44 and 46 of the instantaneous digital frequency of respective unfiltered encoder signal 38 and filtered encoder signal 42. As demonstrated by such graphs suitable frequency filtering of the encoder signal 38 results in a filtered encoder signal 42 having a much smoother, and therefore more accurate transition between frequencies, enabling the timing of pulses delivery to the printhead heater resistors to be more accurately controlled.

Thus, the key to the present invention is eliminating from the raw encoder signal 38 frequency components which are attributable to noise or other disturbances in the print system. As many of these frequency components occur at high frequencies, a preferred implementation is to provide an encoder signal frequency filter which acts as a low pass frequency filter to remove such high frequency components.

Figure 5:
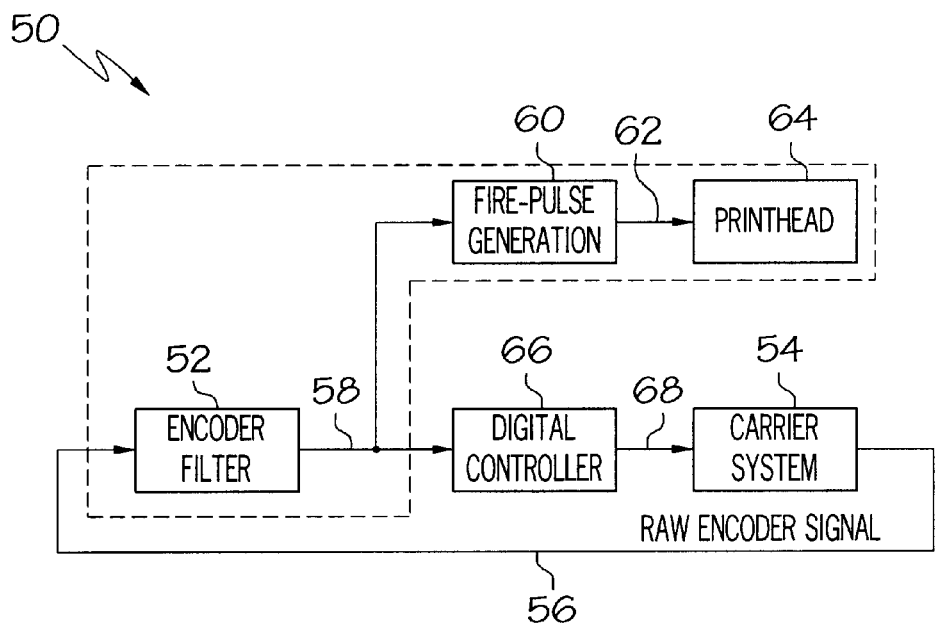
FIG. 5 is a schematic diagram of an encoder signal filtering arrangement according to one embodiment of the invention.

An exemplary system arrangement 50 including such an encoder signal frequency filter 52 is shown in FIG. 5. Carrier system 54 represents the carriage 12, motor 16 and encoder 20, 22 combination. The raw encoder signal is provided as an output at 56 and is fed to the encoder signal frequency filter 52 where frequency variations of the digital encoder signal which meet at least one predetermined parameter are removed, providing a frequency filtered digital signal 58. In a preferred arrangement a threshold frequency variation level is set and the predetermined parameter is any frequency variation which exceeds the set threshold. The frequency filtered digital signal 58 is provided to a fire pulse generation circuit 60 which delivers heater resistor pulses 62 to the heater resistors of the printhead 64. The frequency filtered digital signal 58 is also provided to a digital controller 66 which utilizes the signal 58 to produce a motor controlling output signal 68 which is delivered to the carrier system 54.

Traditional filtering techniques are generally not appropriate for this application for several reasons. Since a "data point" is only obtained at each rising edge, to provide the necessary filtering of this signal would require several data points and would thus introduce large delays into the signal. These delays could drastically affect the print systems ability to function properly. In present day print control systems the "frequency filtered encoder signal" needs to be reproduced with near zero time delay from the original signal (ie, in phase with the original signal).

Figure 6:
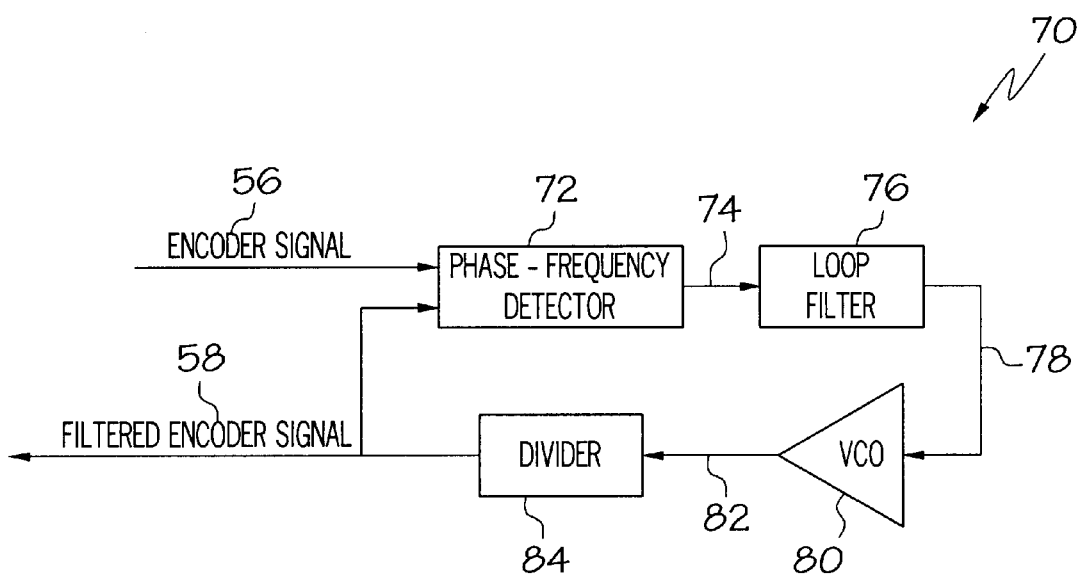
FIG. 6 is a schematic diagram of a phase-locked loop filter.

One possible implementation of such an encoder filter is the utilization of a phase locked loop filter 70 as shown in FIG. 6. The raw encoder signal 56 is provided as an input to a phase frequency detector 72 which in turn outputs a phase difference signal 74 to a loop filter 76 which outputs an analog voltage 78 to a voltage controlled oscillator 80. The VCO 80 produces a digital oscillating signal 82 which is delivered to a divider 84 which produces the frequency filtered encoder signal 58. In one implementation the phase frequency detector 72 may be designed with digital gates, and the loop filter 76 and VCO 80 may be designed using analog devices. A second possible implementation is the use of an all-digital phase-locked loop (ADPLL) in which the loop filter 76, VCO 80 and phase frequency detector 72 are all designed using digital logic as described in copending application Ser. No. 09/440,795 filed Nov. 15, 1999, the entire specification of which is incorporated herein by reference. In either implementation the primary element in the phase-locked loop filter will be the loop filter 76 which typically determines the closed loop dynamics of the PLL system. Thus the design of the loop filter 76 will be of primary import in establishing the threshold frequency variation level.

Figure 7:
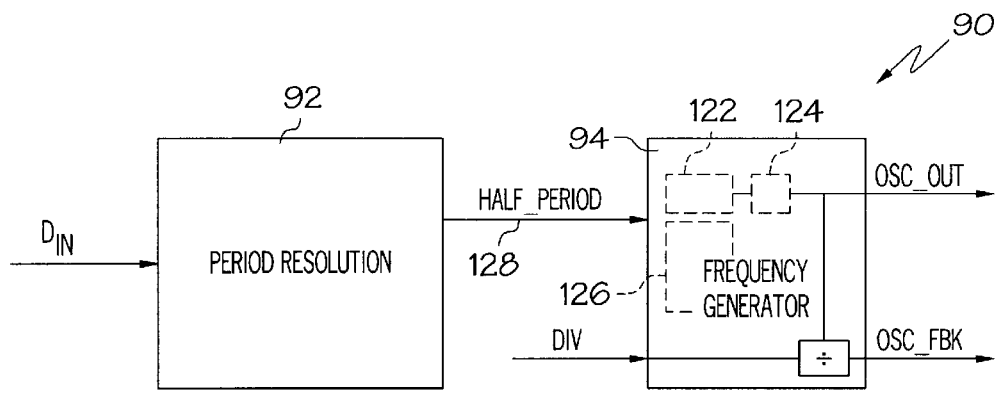
FIG. 7 is a schematic diagram of a digital oscillator design useful in connection with encoder signal filtering.

It is also recognized that a digitally controlled oscillator (DCO) could be used in place of VCO 80. In this regard, an advantageous configuration for a digitally controlled oscillator 90 is shown in FIG. 7. The DCO 90 includes a period resolution circuit 92 and a frequency generating circuit 94. The operation of the DCO 90 is best understood by beginning with the desired input/output relationship. The input $D_{in}$ is a digital word of n bits wide and therefore has a range from 0 to $2^{n-1}$. The output is one digital signal (OSC_OUT) that oscillates at a frequency determined by the input $D_{in}$, as well as range and gain. As the input $D_{in}$, varies, the output (OSC_OUT) should vary linearly with respect to the input.

In order to generate an oscillating signal in a digital system, its period must be determined as opposed to the frequency itself. A counter can then be loaded and edges can be generated based upon the expiration of this counter.

The relationship between (T) and frequency (F) is as follows:

$$T = \frac{1}{f} \frac{\sec}{\text{period}} \quad (1)$$

Since the input, $D_{in}$ is proportional to the frequency it becomes apparent that to resolve T with any precision a division operation will be necessary. It turns out that the divider is the core of the design, taking up most of its silicon area. Translating the input $D_{in}$ which varies from 0 to $2^{n-1}$ to a period will require more hardware than just a divider. To make the DCO more useful, some programmability is necessary. To achieve an operable frequency range, two registers are added, namely a minimum of frequency register $f_0$ and a gain or frequency per step with respect to the $D_{in}$, which will be called G. Expanding equation 1 for these provisions results in equation 2 below:

$$T = \frac{1}{f_0 + G*Din} \frac{\sec}{\text{period}} \quad (2)$$

It is apparent that the units of T, sec/period, have no place in the digital system and therefore this value must be translated into clock cycles. The use of clock cycles brings up another issue of programmability, namely what is the clock speed. Accordingly, another register is added to hold the frequency of the system clock in Hz and is called register $F_{clk}$. A period value ($T_{clk}$), which has units of system clock cycles per period, can now be defined by equation 3 set forth below:

$$T_{CLK} = \frac{1}{f_0 + G*Din} \frac{\sec}{\text{period}} * F_{CLK} \frac{\text{cycles}}{\sec} \quad (3)$$

$$T_{CLK} = \frac{F_{CLK}}{f_0 + G*Din} \frac{\text{cycles}}{\text{period}}$$

Realizing that it is necessary to generate both rising and falling edges on the oscillating output, it makes more sense to generate a half period value instead of a full period value. This is easily accomplished by simply dividing equation 3 by 2 resulting in equation 4 below:

$$\frac{1}{2}T_{CLK} = \frac{(0.5)F_{CLK}}{f_0 + G*Din} \frac{\text{cycles}}{\text{period}} \quad (4)$$

Figure 8:
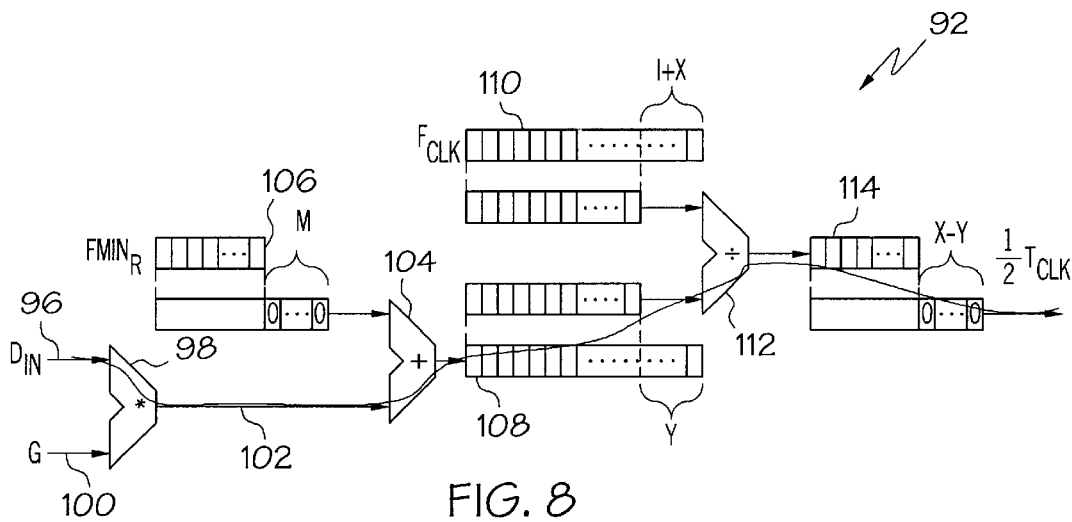
FIG. 8 is a diagram illustrating a hardware implementation of a period resolution circuit which implements Equation 6.

Now that an equation has been established, it must be translated into usable hardware, preferably exploiting powers of 2 multiplication and division where possible. This becomes very important in reducing bus widths because as the widths of the words to be divided increase, divide time and area rapidly increase. First, the conversion of the divide by 2 to a shift is depicted below by equation 5:

$$\frac{1}{2}T_{CLK} = \frac{F_{CLK} \gg 1}{f_0 + G*Din} \frac{\text{cycles}}{\text{period}} \quad (5)$$

where >>1 represents a one bit right shift operation. Further bus with reduction can be achieved by performing some shifting of the numerator and denominator as demonstrated by equation 6 below:

$$\frac{1}{2}T_{CLK} = \frac{F_{CLK} \gg (1+x)}{(FMIN_R \ll m + G*Din) \gg y} \ll (x-y) \frac{\text{cycles}}{\text{period}} \quad (6)$$

Where $f_0 = FMIN_R * 2^m$, and $FMIN_R$ is the reduced bit width minimum frequency register, x is the shift-right value of the numerator and y is the shift-right value for the denominator. The translation of Equation 6 into hardware is shown in FIG. 8, where period resolution circuit 92 includes an input 96 for receiving digital frequency selection value $D_{in}$. Digital multiplier 98 also includes an input 100 which receives gain value G, with multiplier 98 multiplying $D_{in}$ by G to produce a resultant value at 102 which in turn is fed to a digital adder 104 a minimum frequency register $FMIN_r$ 106 is provided and inputs a minimum frequency value to the digital adder 104 which outputs a summed value to register 108. A clock frequency register $F_{clk}$ is provided at 110 for holding the frequency of the system clock. Digital divider 112 divides the digital clock frequency value of register 110 by the summed value of register 108. Prior to being input to the digital divider 112 the digital clock frequency value of register 110 may be right-shifted by (1+x) places and the summed value of register 108 may be right-shifted by y places. The digital divider 112 outputs a count value indicative of a number of clock frequency pulses occurring during one half of a period of a desired oscillator output frequency to a register 114. Where the values x and y are different, the count number in register 114 is left shifted by (x−y) spaces to produce the count value (½$T_{clk}$).

Figure 9:
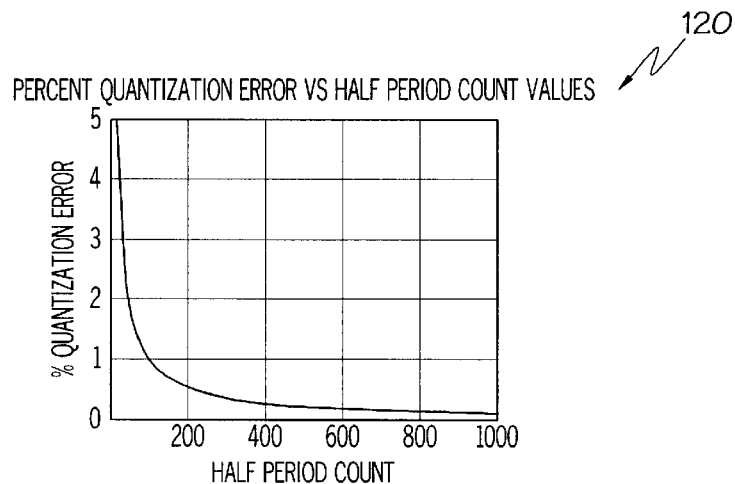
FIG. 9 is a quantization error graph relating to the period resolution circuit of FIG. 8.

It is critical that the parameters and elements used to implement the period resolution circuit 92 of FIG. 8 are chosen carefully. The parameters will depend on the frequency range in which it must operate and the frequency at which $D_{in}$ will be changing. The rate at which $D_{in}$ is changing will govern the necessary speed of the multiplier 98, adder 104 and divider 112 chain. The accuracy of the calculation at higher frequencies is governed by x, y, and $F_{clk}$, making it apparent that these are also the parameters that govern the upper limit of the frequency that can be generated by the digital oscillator. The most important of these parameters to consider is $F_{clk}$ which, when too slow, will cause large quantization error when the resultant ½ is relatively small. (For example, 200 or smaller). Suitable control achieved by defining a relationship between these two frequencies that will give desired results. Based upon the quantization error graph shown in FIG. 9, a basic rule of thumb can be achieved. Each application of the design may require different tolerances for the quantization error. However, a good rule of thumb is to keep the error below 0.5%, which requires that the half period count value ½ $T_{clk}$ be greater than 200 at the digital oscillator's highest output frequency. The resulting design control equations follow:

$$\frac{F_{CLK}}{200} \geq 2 * F_{MAX} \quad (7)$$

$$F_{CLK} \geq 400 * F_{MAX}$$

or $$F_{CLK} * CQE \geq 2 * F_{MAX} \quad (8)$$

$$F_{CLK} \geq \frac{2 * F_{MAX}}{CQE}$$

Once the half period count value ½ $T_{clk}$ is determined by the period resolution circuit 92 it is provided to the frequency generator circuit 94 where it is loaded into a down counter 122. Once loaded the down counter 122 begins to count down from the loaded value and when it reaches a 0 value it triggers an associated toggle circuit 124 to switch the output signal from a high level to a low level, or from a low level to a high level.

Figure 10:
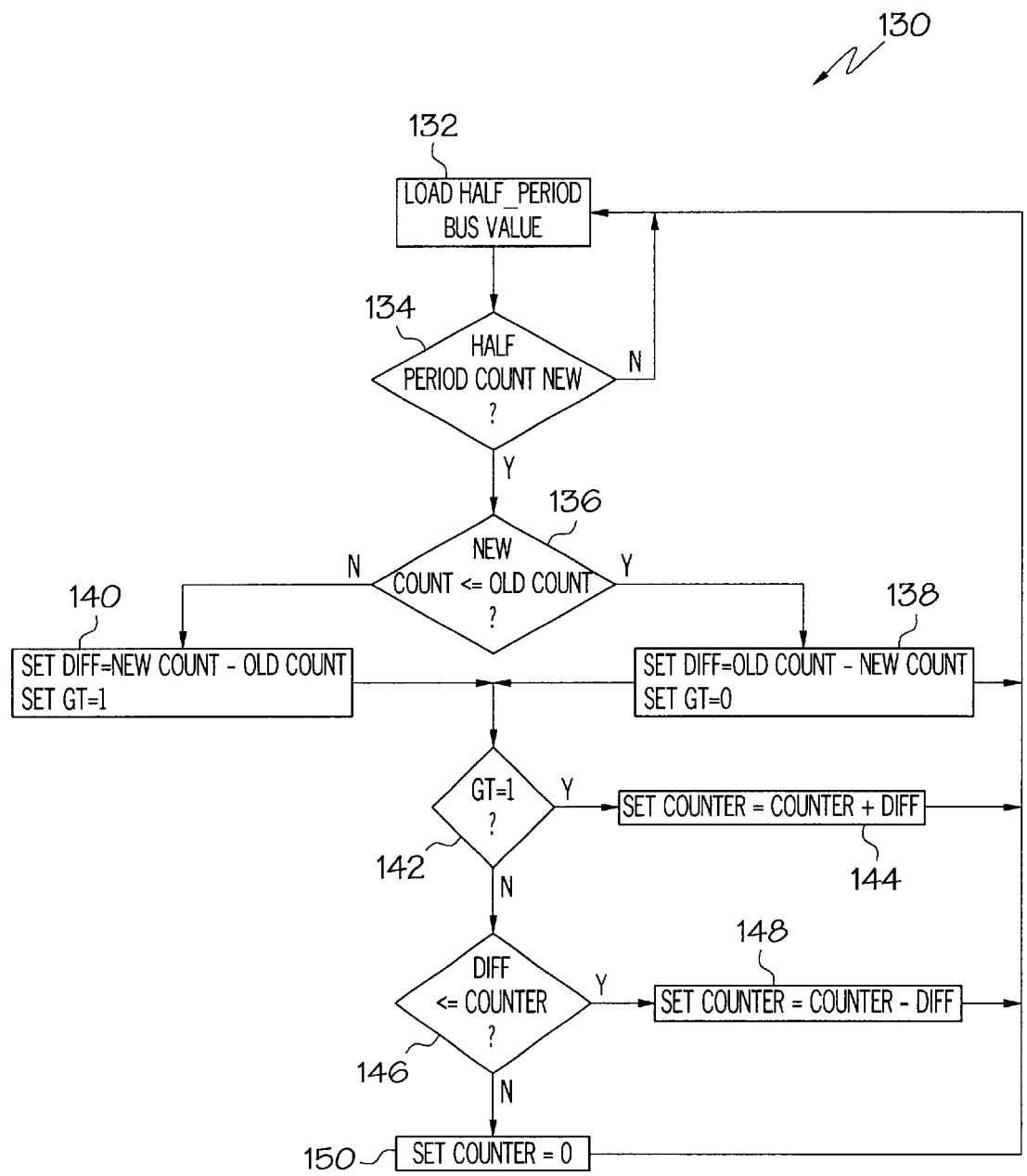
FIG. 10 is a flowchart of logic steps performed by the frequency generator of FIG. 7.

An additional control circuit 126 is provided to detect changes on the half period bus 128 and to adjust the value in counter 122 accordingly, to allow for smooth frequency transitions. In particular, as shown by the flow chart 130 of FIG. 10 the control circuit 126 operates by loading the count value at the half period bus 128 as shown at step 132. At step 134, if the loaded count value is not changed, step 132 is repeated. Otherwise, at step 136 the new count is compared to the old count. If the new count is less than or equal to the old count a difference variable DIFF is set equal to the old count minus the new count and a greater than variable GT is set equal to 0 at step 138. If the new count is greater than the old count then difference variable DIFF is set equal to the new count minus the old count and greater than variable GT is set equal to 1 at step 140.

At step 142 the greater than variable is checked and if equal to 1 the value in the counter 122 is increased by the value DIFF as indicated at step 144. If GT is not equal to 1 then DIFF is compared to the value in the counter at step 146. If DIFF is less than or equal to the value in the counter then the value in the counter is decreased by the value DIFF at step 148 otherwise at step 150 the value in the counter is set to 0 and step 132 is repeated.

The above described logic results in the value within the counter 122 being updated immediately upon receipt of a new half period count value on the bus 128 in order to more quickly reflect the change in frequency represented by the new half period count value. For example, assume an old count value of 1,000 loaded into the counter 122 which begins to count down. Assume also that when the counter 122 reaches a count of 500 a new half period count value of 750 is received on the half period bus 128. The new count (750) is less than or equal to the old count (1,000) at step 136 and therefore DIFF is set equal to 1,000 minus 750, or 250 at step 138 and GT is set equal to 0. At step 142 GT is not equal to 1 and therefore at step 146 DIFF (250) is less than or equal to the current counter value (500). Accordingly at step 148 the counter value is reset to 500 minus 250, or 250, so that the counter can immediately reflect the change in frequency represented by the new count (750). As a second example, assume that an old count value of 1,000 is loaded into the counter 122. Also assume that when the counter reaches a value of 500 a new count value of 1,100 is received on the half period bus 128. At step 136 the new count (1,100) is not less than or equal to the old count (1,000) and therefore at step 140 DIFF is set equal to 1,100 minus 1,000, or 100, and GT is set equal to 1. At step 142 GT is equal to 1 and therefore at step 144 the current counter value is reset to 500 plus 100 or 600. Again, by updating the counter value in this manner frequency changes are more immediately realized in the oscillating digital output signal.

The above described DCO 90 represents a significant improvement in digitally controlled oscillators and may be particularly useful in the encoder signal filtering arrangement provided herein. However, it is recognized that DCO 90 will have many advantageous applications in other areas.

Figure 11:
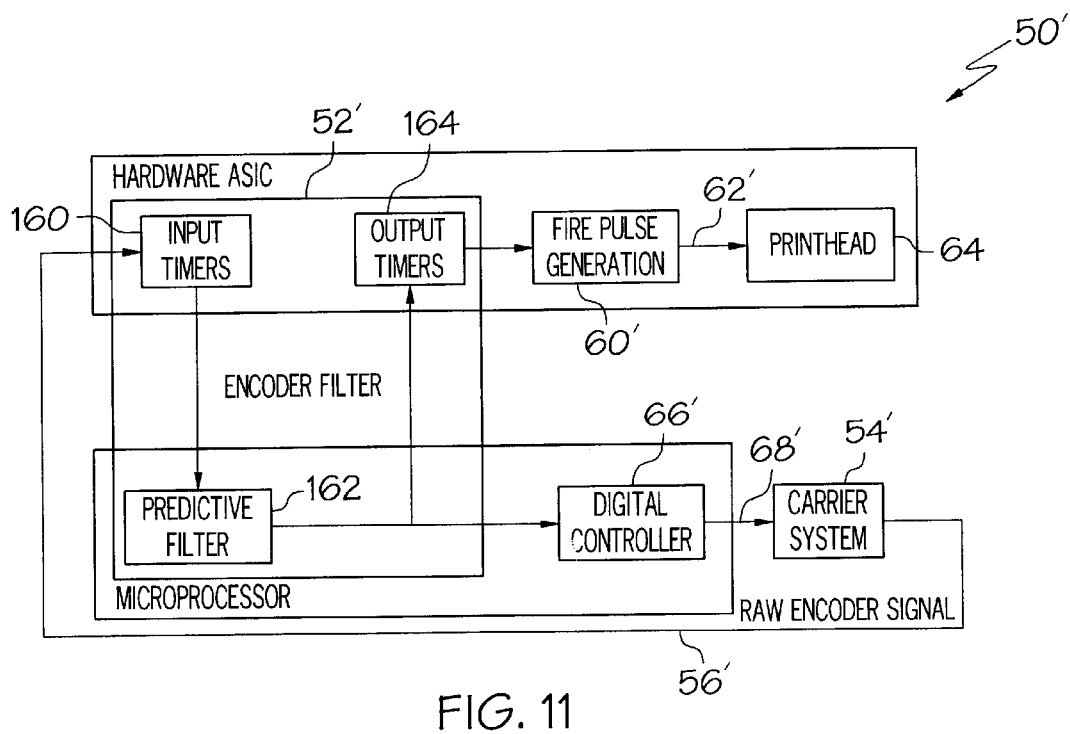
FIG. 11 is a schematic diagram of an encoder signal filtering arrangement according to another embodiment of the invention.
Figure 12:
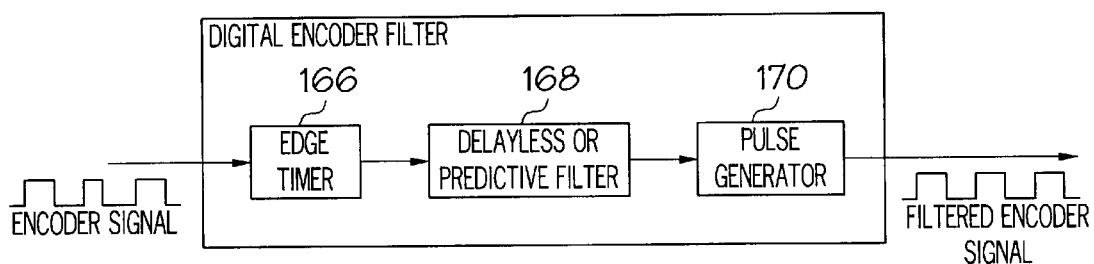
FIG. 12 is a schematic diagram of yet another filtering arrangement.

A further embodiment of an encoder signal frequency filter which can be utilized is described with FIG. 11. In this embodiment a predictive filter arrangement 52' is provided utilizing a combination of hardware and software based modules. In particular the encoder output signal 56' is provided as an input to a hardware implemented edge timer 160 which measures the time between the transitions of the raw encoder signal 56'. These output values from the input timers are fed to the microprocessor which includes a predictive filter algorithm module 162. The predictive filter algorithm module 162 could be any one of several known methods such as the "soft filtering" techniques developed by Ovaska et al. which are described in the following references: "Predictive Compensation Of Time Varying Computing Delay On Real Time Control Systems," *IEE Transactions On Control Systems Technology*, vol. 5, no. 5, pp. 523–526, September 1997; "Design Of Predictive IIR Filters Via Feedback Extension Of FIR Forward Predictors," *IEEE Transactions On Instrumentation And Measurement*, vol. 46, no. 5, pp. 1196–1201, October 1997; and "Low Pass IIR Predictors For Discrete Time Signal Processing," *Digital Signal Processing*, vol. 5, no. 3, pp. 133–139, July 1995. Other predictive methods based on neural network or fuzzy systems theory, or more traditional Newton type predictive filters could also be utilized for the module 162. The predictive module 162 determines the desired placement in time of the edges of the filtered signal. The output of the predictive filter module may be a time value which is delivered to hardware based output timer 164 which responsively produces the filtered digital oscillating signal with rising and falling edges corresponding to the times received from the predictive filter. FIG. 12 depicts a similar arrangement in which an edge timer 166 is utilized to determine the period of the incoming encoder signal, a delayless or predictive hardware implemented filter module 168 is utilized to determine the appropriate timing for the rising and falling edges of the filtered digital encoder signal, and such times are delivered to a hardware implemented pulse generator 170 which produces the frequency filtered encoder signal.

Regardless of the type of filter utilized, the encoder signal filtering arrangement provides a frequency filtered digital encoder signal which more accurately represents the position and speed of the printhead carriage. Preferably, frequency components or variations in the raw encoder signal which represent undesirable noise or other disturbances such as belt disturbances are removed by the frequency filtering arrangement. A method for providing increased printing accuracy in an ink jet printer is therefore provided and includes the steps of providing an encoder for producing a digital output signal indicative of movement of a printhead across a paper path, monitoring the digital output signal, eliminating frequency changes in the digital output signal which occur at a rate faster than a threshold change rate to produce a filtered digital signal, and producing printhead firing pulses based at least in part upon the filtered digital signal.

Although the invention has been described above in detail referencing the preferred embodiments thereof, it is recognized that various changes and modifications could be made without departing from the spirit and scope of the invention.

What is claimed is:

1. A printhead firing control system for an inkjet printer, comprising:
   a printhead mounted for movement across a paper path;
   an encoder for producing a digital output signal indicative of movement of the printhead;
   a filter circuit connected to receive the digital output signal for filtering the digital output signal to remove frequency variations which meet at least one predetermined parameter, the filter circuit providing a filtered digital signal; and
   a fire-pulse generation circuit connected to receive the filtered digital signal from the filter circuit and producing printhead heater resistor drive pulses based at least in part upon the filtered digital signal; and
   wherein the predetermined parameter comprises exceeding a threshold frequency variation level;
   wherein the printhead is mounted to a carriage which is driven by a belt, and the threshold frequency variation level is below a frequency of belt disturbances affecting the digital output signal.

2. The system of claim 1 wherein the filter circuit comprises a digital phase-locked loop filter arrangement.

3. The system of claim 2 wherein the digital phase-locked loop filter arrangement includes a digitally controlled oscillator.

4. The system of claim 2 wherein the digital phase-locked loop filter arrangement includes a phase frequency detector.

5. A printhead firing control system for an inkjet printer, comprising:
  a printhead mounted for movement across a paper path;
  an encoder for producing a digital output signal indicative of movement of the printhead;
  a filter circuit connected to receive the digital output signal for filtering the digital output signal to remove frequency variations which meet at least one predetermined parameter, the filter circuit providing a filtered digital signal;
  a fire-pulse generation circuit connected to receive the filtered digital signal from the filter circuit and producing printhead beater resistor drive pulses based at least in part upon the filtered digital signal;
  wherein the predetermined parameter comprises exceeding a threshold frequency variation level;
  wherein the filter circuit comprises a predictive filter arrangement;
  wherein the predictive filter arrangement comprises a hardware implemented edge timer for receiving the digital output signal, a hardware-implemented filter module connected to an output of the edge timer, and a hardware-implemented pulse generator connected to the output of the filter module.

6. A printhead firing control system for an inkjet printer, comprising:
  a printhead mounted for movement across a paper path;
  an encoder for producing a digital output signal indicative of movement of the printhead;
  a filter circuit connected to receive the digital output signal for filtering the digital output signal to remove frequency variations which meet at least one predetermined parameter, the filter circuit providing a filtered digital signal;
  a fire-pulse generation circuit connected to receive the filtered digital signal from the filter circuit and producing printhead heater resistor drive pulses based at least in part upon the filtered digital signal;
  wherein the predetermined parameter comprises exceeding a threshold frequency variation level;
  wherein the filter circuit comprises a predictive filter arrangement;
  wherein the predictive filter arrangement includes a hardware-implemented edge timer for receiving the digital output signal, a software implemented filter module for receiving an output of the edge timer, and a hardware-implemented output timer portion for receiving an output of the filter arrangement.

7. A printhead firing control system for an inkjet printer, comprising:
  a printhead mounted for movement across a paper path;
  an encoder for producing a digital output signal indicative of movement of the printhead;
  a filter circuit connected to receive the digital output signal for filtering the digital output signal to remove frequency variations which meet at least one predetermined parameter, the filter circuit providing a filtered digital signal; and
  a fire-pulse generation circuit connected to receive the filtered digital signal from the filter circuit and producing printhead heater resistor drive pulses based at least in part upon the filtered digital signal;
  wherein the predetermined parameter comprises exceeding a threshold frequency variation level; and
  wherein the filter circuit comprises an edge timer for receiving the digital output signal, a predictive filter module connected to receive an output of the edge timer, and a pulse generator connected to receive the output of the predictive filter module, the pulse generator producing the filtered digital signal.

8. A printer system encoder arrangement, comprising:
  an encoder for producing a digital output signal indicative of movement of a printer structure; and
  a filter circuit connected to receive the digital output signal for filtering the digital output signal to remove frequency variations which exceed a threshold level, the filter circuit providing a filtered digital signal;
  wherein the threshold level is below a frequency of belt disturbances affecting the digital output signal.

9. The system of claim 8 wherein the filter circuit comprises a digital phase-locked loop filter.

10. The system of claim 9 wherein the digital phase-locked loop filter arrangement includes a phase frequency detector.

11. The system of claim 8 wherein the filter circuit comprises a predictive filter arrangement.

* * * * *